(12) United States Patent
Lai et al.

(10) Patent No.: US 9,576,972 B2
(45) Date of Patent: Feb. 21, 2017

(54) SEMICONDUCTOR DEVICE AND MANUFACTURING METHOD THEREOF

(71) Applicant: MACRONIX INTERNATIONAL CO., LTD., Hsinchu (TW)

(72) Inventors: Erh-Kun Lai, Taichung (TW); Kuang-Hao Chiang, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/730,340

(22) Filed: Jun. 4, 2015

(65) Prior Publication Data

US 2016/0247814 A1    Aug. 25, 2016

Related U.S. Application Data

(63) Continuation-in-part of application No. 14/629,537, filed on Feb. 24, 2015, now Pat. No. 9,437,611.

(51) Int. Cl.
| | |
|---|---|
| *H01L 27/115* | (2006.01) |
| *H01L 21/28* | (2006.01) |
| *H01L 21/311* | (2006.01) |
| *H01L 29/423* | (2006.01) |
| *H01L 21/764* | (2006.01) |

(52) U.S. Cl.
CPC ... *H01L 27/11582* (2013.01); *H01L 21/28282* (2013.01); *H01L 21/31144* (2013.01); *H01L 21/764* (2013.01); *H01L 29/4234* (2013.01)

(58) Field of Classification Search
None
See application file for complete search history.

(56) References Cited

U.S. PATENT DOCUMENTS

| | | | |
|---|---|---|---|
| 9,130,054 B2 * | 9/2015 | Jang | H01L 29/792 |
| 9,171,729 B2 * | 10/2015 | You | H01L 27/11582 |
| 9,305,937 B1 * | 4/2016 | Tsutsumi | H01L 27/11582 |
| 2013/0270631 A1 * | 10/2013 | Kim | H01L 29/7827 257/331 |
| 2014/0141583 A1 | 5/2014 | Hung et al. | |

(Continued)

FOREIGN PATENT DOCUMENTS

TW    201517242 A    5/2015

OTHER PUBLICATIONS

TW Office Action dated Apr. 13, 2016 in Taiwan application (No. 104118236).

*Primary Examiner* — Ali Naraghi
(74) *Attorney, Agent, or Firm* — McClure, Qualey & Rodack, LLP

(57) ABSTRACT

A semiconductor device and a manufacturing method of a semiconductor device thereof are provided. The manufacturing method includes the following steps. Two stacked structures are formed a substrate. Each of the stacked structures includes a plurality of gate layers, a plurality of gate insulating layers and a top insulating layer. A charge trapping structure and a channel layer are formed. The charge trapping structure includes a plurality of first dielectric layers and a plurality of second dielectric layers. Part of each of first dielectric layers is etched and part of each of second dielectric layers is etched to expose part of the channel layer. A landing pad layer is formed on the first dielectric layers and the second dielectric layers to connect the channel layer.

11 Claims, 13 Drawing Sheets

(56) References Cited

U.S. PATENT DOCUMENTS

| | | | |
|---|---|---|---|
| 2015/0115344 A1* | 4/2015 | Lai .................... | H01L 27/11565 257/314 |
| 2016/0148946 A1* | 5/2016 | Hironaga .......... | H01L 27/11556 257/324 |
| 2016/0181264 A1* | 6/2016 | Miyamoto ........ | H01L 27/11524 257/314 |

* cited by examiner

SEMICONDUCTOR DEVICE AND MANUFACTURING METHOD THEREOF

This is a continuation-in-part application of U.S. application Ser. No. 14/629,537, filed Feb. 24, 2015, the subject matter of which is incorporated herein by reference.

BACKGROUND

Technical Field

The disclosure relates in general to a semiconductor device and a manufacturing method thereof, and more particularly to a vertical channel semiconductor device and a manufacturing method thereof.

Description of the Related Art

In recent years, the structures of semiconductor devices have been changed constantly, and the storage capacity of the devices has been increased continuously. Memory is used for storing varied electronic products such as MP3 files, digital images, computer documents, etc. As the application increases, the demand for the memory focuses on small size and large memory capacity. For satisfying the requirement, a memory having a high element density and a small size and the manufacturing method thereof are in need.

As such, it is desirable to develop a vertical channel memory to achieve greater storage capacity, a small size, and yet having excellent property and stability.

SUMMARY

The disclosure is directed to a semiconductor device and a manufacturing method thereof. Part of a charge trapping structure is etched and then a landing pad layer is formed to form a thick and wide landing pad for stably connecting with a bit line.

According to a first aspect of the present disclosure, a manufacturing method of a semiconductor device is provided. The manufacturing method includes the following steps. Two stacked structures are formed above a substrate. Each of the stacked structures includes a plurality of gate layers, a plurality of gate insulating layers and a top insulating layer. The gate layers and the gate insulating layers are alternately disposed. The top insulating layer is disposed on the gate layers and the gate insulating layers. A charge trapping structure and a channel layer are formed on a lateral surface of each of the stacked structures. The charge trapping structure includes a plurality of first dielectric layers and a plurality of second dielectric layers. Part of each of first dielectric layers is etched and part of each of second dielectric layers is etched to expose part of the channel layer. A landing pad layer is formed on the first dielectric layers and the second dielectric layers to connect the channel layer.

According to a second aspect of the present disclosure, a semiconductor device is provided. The semiconductor includes a substrate, two stacked structures, a charge trapping structure, a channel layer and a landing pad layer. Each of the stacked structures includes a plurality of gate layers and a plurality of gate insulating layers and a top insulating layer. The gate layers and the gate insulating layers are alternately disposed. The top insulating layer is disposed on the gate layers and the gate insulating layers. The charge trapping structure and the channel layer are disposed on a lateral surface of each of the stacked structures. The charge trapping structure includes a plurality of first dielectric layers and a plurality of second dielectric layers. A top of the channel layer is higher than a top of each of the first dielectric layers and a top of each of the second dielectric layers. The landing pad layer is disposed on the first dielectric layers and the second dielectric layers for connecting the channel layer.

The above and other aspects of the disclosure will become better understood with regard to the following detailed description of the non-limiting embodiment(s). The following description is made with reference to the accompanying drawings.

DETAILED DESCRIPTION

Preferred embodiments are disclosed below for elaborating the invention. Part of a charge trapping structure is etched and then a landing pad layer is formed to form a thick and wide landing pad for stably connecting with a bit line. The following embodiments are for the purpose of elaboration only, not for limiting the scope of protection of the invention. Besides, secondary elements are omitted in the following embodiments to highlight the technical features of the invention.

Figure 1:
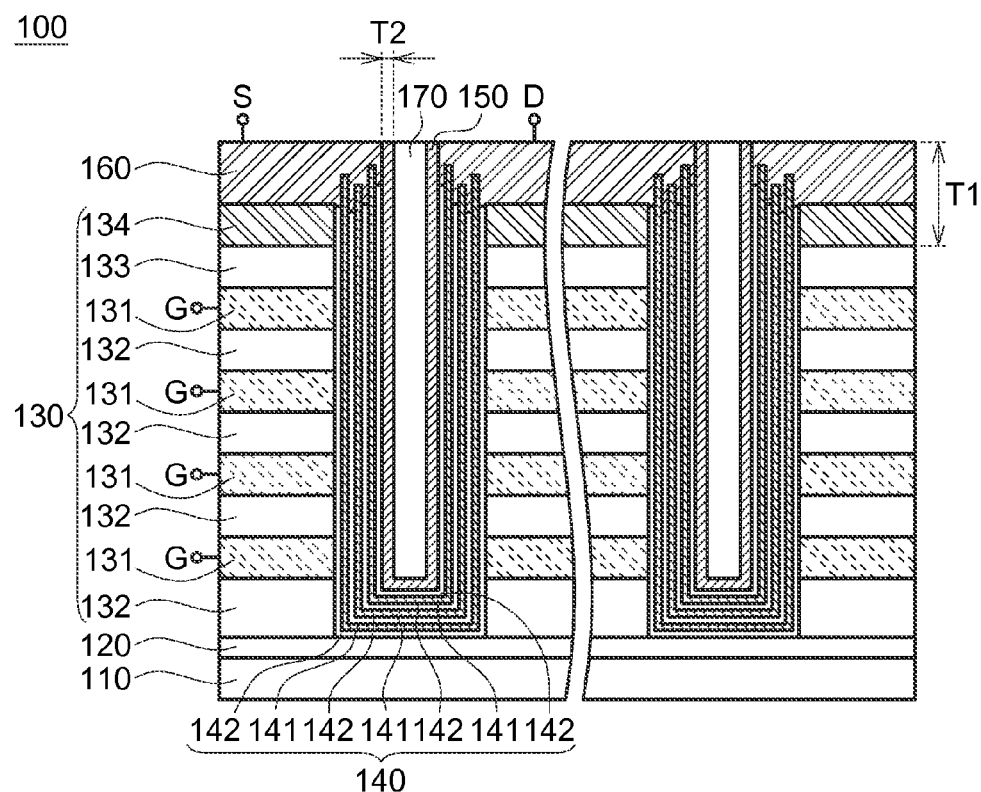
FIG. 1 shows a semiconductor device.

Please referring FIG. 1, a semiconductor device 100 is shown. For example, the semiconductor device 100 is a three-dimensional vertical channel NAND device. The semiconductor device 100 includes a substrate 110, a bottom insulating layer 120, at least two stacked structures 130, a charge trapping structure 140, a channel layer 150, a landing pad layer 160 and a spaced insulating layer 170. In this embodiment, the charge trapping structure 140 and the channel layer 150 are U shaped.

Each stacked structure 130 includes a plurality of gate layers 131, a plurality of gate insulating layers 132, a top insulating layer 133 and a conductive mask layer 134. The charge trapping structure 140 includes a plurality of first dielectric layer 141 and a plurality of second dielectric layer 142. Each gate layer 131 is connected to a gate G, the landing pad layer 160 is connected to a source S or a drain D.

The landing pad layer 160 is connected to a bit line. As shown in FIG. 1, because a thickness T1 of a combination of the conductive mask layer 134 and the landing pad layer 160 is larger than a thickness T2 of the channel layer 150, a contact resistance between the bit line and the landing pad layer 160 can be reduced. Furthermore, it is easy to make a contact between the bit line and the landing pad layer 160. Moreover, the connection between the channel layer 150 and the landing pad layer 160 is at the side-wall of the channel layer 150, not at the top of the channel layer 150. It will improve the process window and reduce the resistance. In addition, no corner edge effect will be happened in this structure. The reason is that there is no first dielectric layer 141 (SiN) at any corner edge which will be easily programmed/erased due to the electric field enhancement.

Figure 2A:
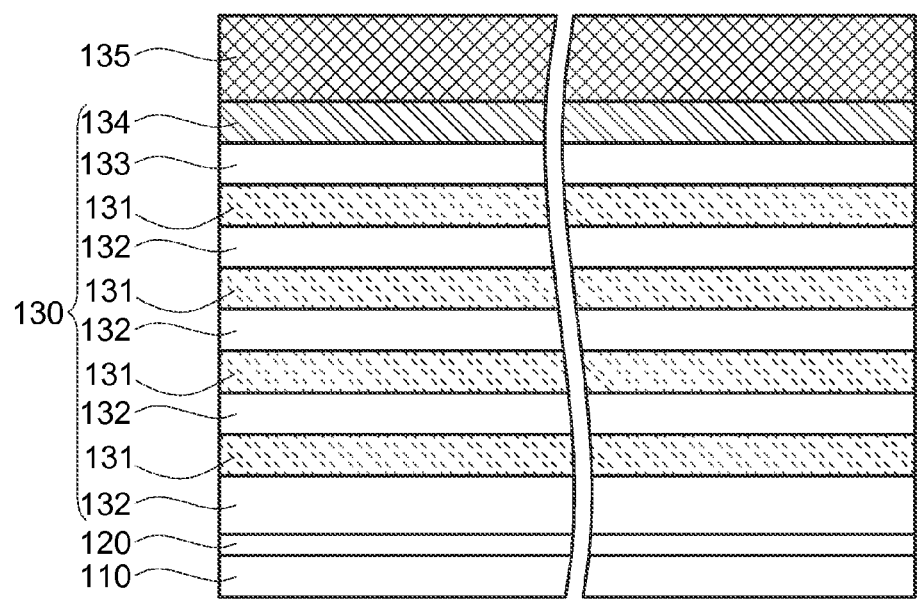
FIGS. 2A to 2F show a flowchart of a manufacturing method of the semiconductor device according to one embodiment.

Please referring to FIGS. 2A to 2F, a flowchart of a manufacturing method of the semiconductor device 100 according to one embodiment is shown. It is a self-aligned process without any additional lithography process. As shown in FIG. 2A, the substrate 110 is provided. Then, as shown in FIG. 2A, the bottom insulating layer 120 is formed on the substrate 110. For example, a material of the bottom insulating layer 120 is silicon oxide.

Next, as shown in FIG. 2A, the gate layers 131 and the gate insulating layer 132 are alternately formed on the bottom insulating layer 120, such that the gate layers 131 are electrically insulated with each other. For example, a material of each gate layer 131 may be N+ or P+ doping polysilicon, preferred P+ doping polysilicon, and a material of each gate insulating layer 132 is silicon oxide.

Then, as shown in FIG. 2A, the top insulating layer 133 is formed on the gate layers 131 and the gate insulating layers 132. For example, a material of the top insulating layer 133 is silicon oxide.

Next, as shown in FIG. 2A, the conductive mask layer 134 is formed on the top insulating layer 133 for preventing etching the top insulating layer 133 and connecting to the landing pad layer 160 (shown in FIG. 1) and the channel layer 150 (shown in FIG. 1).

Then, as shown in FIG. 2A, the insulating mask layer 135 is formed on the conductive mask layer 134. For example, a material of the insulating mask layer 135 is silicon nitride.

Figure 2B:
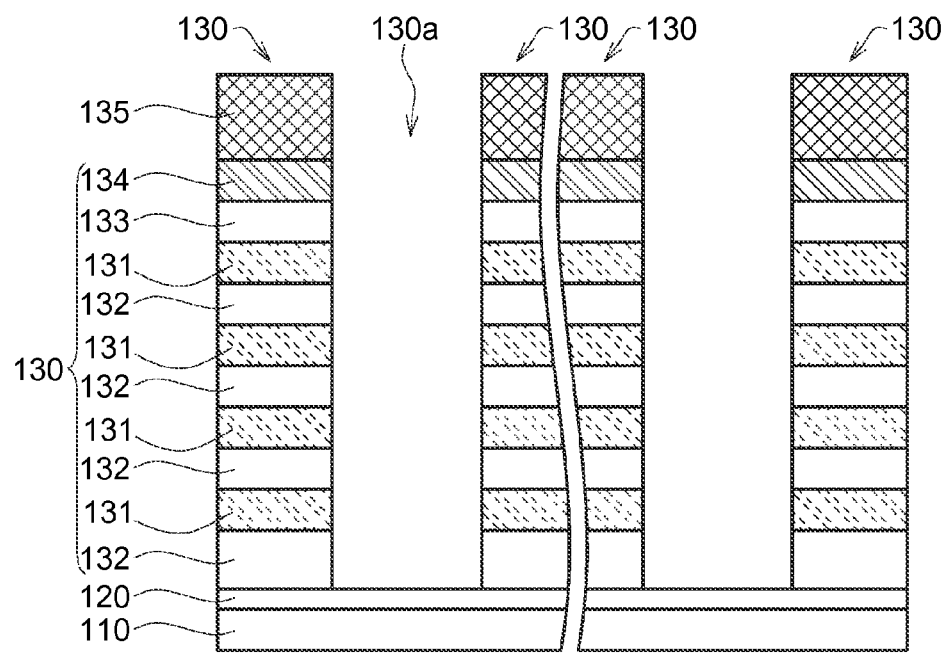

Next, as shown in FIG. 2B, the insulating mask layer 135, the conductive mask layer 134, the top insulating layer 133, the gate layers 131, the gate insulating layers 132 are etched to form two stacked structures 130 and a trench 130a located therebetween. The insulating mask layer 135 is used for stabilizing the stacked structures 130 during the manufacturing process.

Figure 2C:
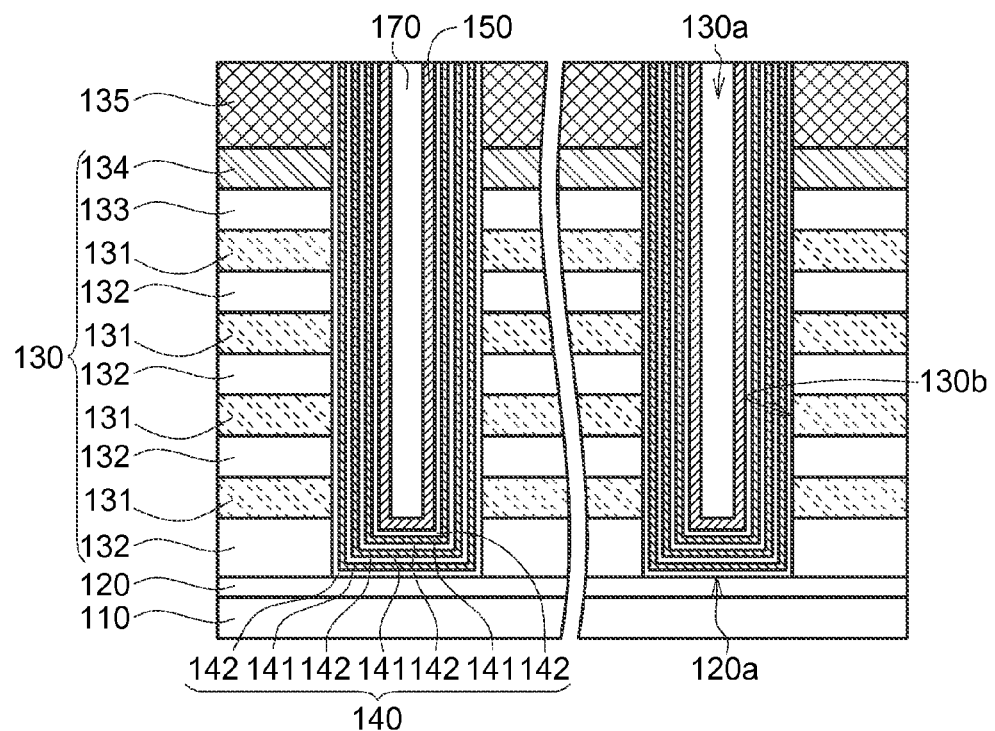

Then, as shown in FIG. 2C, the charge trapping structure 140 and the channel layer 150 are formed on a lateral surface 130b of each stacked structure 130 and a top surface 120a of the bottom insulating layer 120. The charge trapping structure 140 and the channel layer 150 are U shaped. A material of the channel layer 150 may be an intrinsic or undoped polysilicon. For example, the charge trapping structure 140 may be an O1N1O2N2O3N3O4 structure (O1 is closer to the channel layer 150 and O4 is closer to the stacked layer 130). The 4 different silicon oxide layers (O1, O2, O3 and O4) have different thicknesses and the 3 different silicon nitride layer (N1, N2, N3) have different thicknesses. Or, the charge trapping structure 140 may be an O1N1O2N2O3 (O1 is closer to the channel layer 150 and O3 is closer to the stacked layer 130). The 3 different silicon oxide layers (O1, O2, O3) have different thicknesses and the 2 different silicon nitride layers (N1, N2) have different thicknesses. The different thicknesses are based on the purpose of tunneling (O1N1O2), trapping (N2), blocking (O3 or O3N3O4).

Next, as shown in FIG. 2C, the spaced insulating layer 170 is filled in the trench 130a formed between the stacked structures 130. For example, a material of the spaced insulating layer 170 is silicon oxide. In this step, the spaced insulating layer 170 may not be fully filled in the trench 130a, and an air gap structure may be formed in the spaced insulating layer 170. Air can be a good insulator.

Figure 2D:
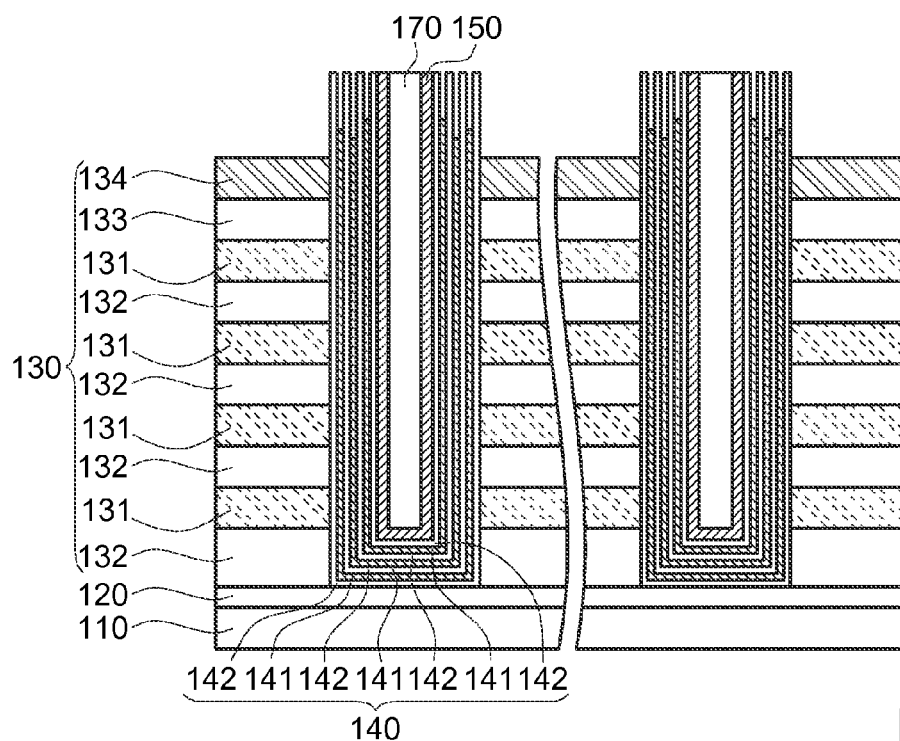

Afterwards, as shown in FIG. 2D, part of each first dielectric layer 141 is etched to expose part of each second dielectric layer 142. In this step, $H_3PO_4$ is used for etching silicon nitride. Because $H_3PO_4$ has high selectivity to polysilicon and silicon oxide, the conductive mask layer 134, the channel layer 150, the second dielectric layers 142 and the spaced insulating layer 170 will not be etched. In this step, the insulating mask layer 135 is removed, so the surface of the conductive mask layer 134 is exposed. Part of the first dielectric layer 141 is etched, so two lateral walls of at least one of the second dielectric layers 142 are partially exposed.

Because thicknesses of the first dielectric layers 141 are different, the first dielectric layers 141 will be etched with different depths under the etching loading effect.

Figure 2E:
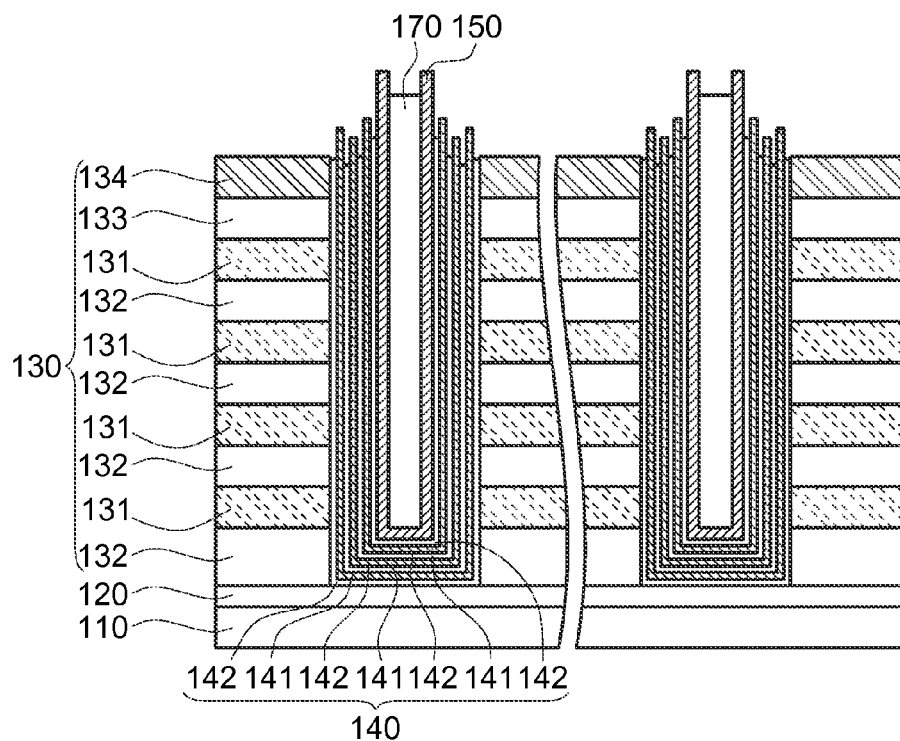

Next, as shown in FIG. 2E, part of each second dielectric layer 142 is etched to expose part of the channel layer 150. In this step, DHF is used for etching silicon oxide. Because DHF has high selectivity to polysilicon and silicon nitride, the conductive mask layer 134, the channel layer 150 and the first dielectric layers 141 will not be etched.

In this step, part of each second dielectric layer 142 is etched, so two lateral walls of each first dielectric layer 141 are exposed. Furthermore, part of the spaced insulating layer 170 is also etched, so two lateral walls of the channel layer 150 are partially exposed, and a top of the channel layer 150 is higher than tops of the first dielectric layers 141 and tops of the second dielectric layer 142.

Because thicknesses of the second dielectric layers 142 are different, the second dielectric layers 142 will be etched with different depths under the etching loading effect. Moreover, the conductive mask layer 134 can prevent the top insulating layer 133 from damage.

Figure 2F:
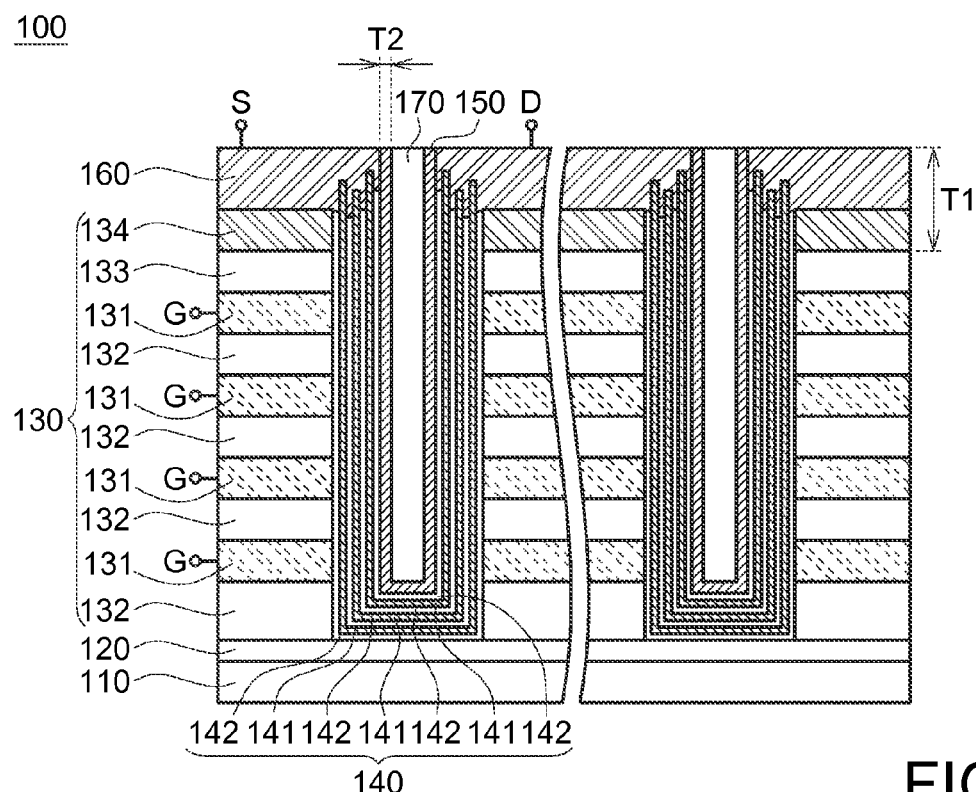

Next, as shown in FIG. 2F, the landing pad layer 160 is formed on the conductive mask layer 134, the first dielectric layers 141 and the second dielectric layers 142 to connect the conductive mask layer 134 and the channel layer 150. For example, a material of the landing pad layer 160 is N type doping polysilicon.

In this step, the landing pad layer 160 and the channel layer 150 are also polished, such that top surfaces of the landing pad layer 160, the channel layer 150 and spaced insulating layer 170 are located at the same level. The combination of the conductive mask layer 134 and the landing pad layer 160 is used as a landing pad for connecting the bit line. The thickness T1 of the combination of the conductive mask layer 134 and the landing pad layer 160 is larger than the thickness T2 of the channel layer 150, such that the contact resistance between the bit line and the landing pad layer 160 can be reduced. Moreover, the connection between the channel layer 150 and the landing pad layer 160 is at the side-wall of the channel layer 150, not at the top of the channel layer 150. It will improve the process window and reduce the resistance. Furthermore, it is easy to make a contact between the bit line and the landing pad layer 160. In addition, no corner edge effect will be happened in this structure. The reason is that no first dielectric layer 141 (SiN) at corner edge which will be easily programmed/erased due to the electric field enhancement.

In the manufacturing method described above, the insulating mask layer 135 is used for stabilizing the stacked structures 130 during the manufacturing process. In one embodiment, the manufacturing method can be performed without forming the insulating mask layer 135. Please referring to FIGS. 3A to 3F, a flowchart of a manufacturing method of a semiconductor device 200 according to another embodiment is shown. In this embodiment, a thickness of a conductive mask layer 234 is increased, such that the conductive mask layer 234 can be used for stabilizing the stacked structure 230.

Figure 3A:
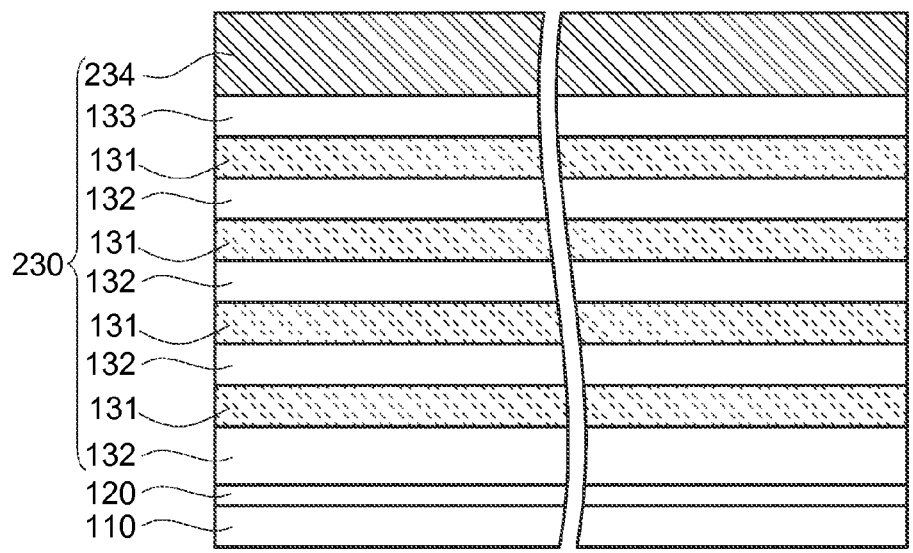
FIGS. 3A to 3F show a flowchart of a manufacturing method of the semiconductor device according to another embodiment.
Figure 3B:
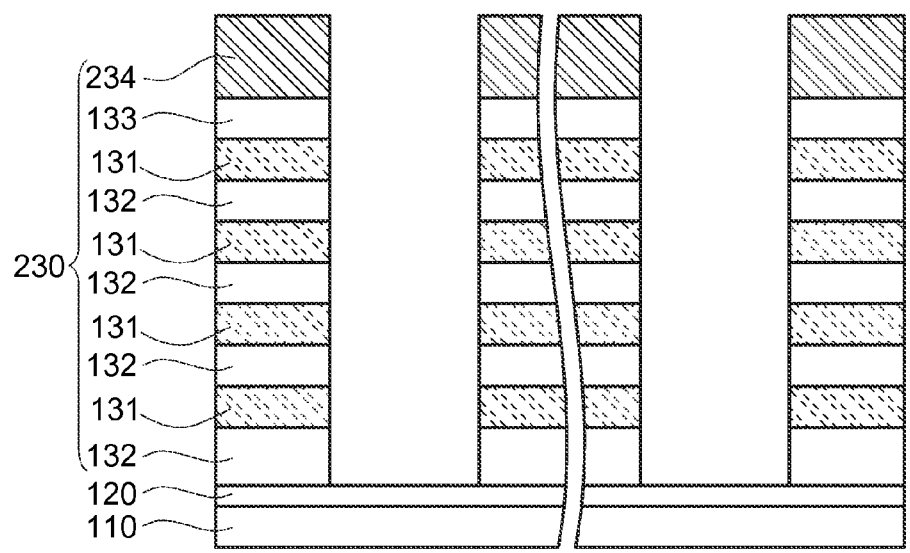
Figure 3C:
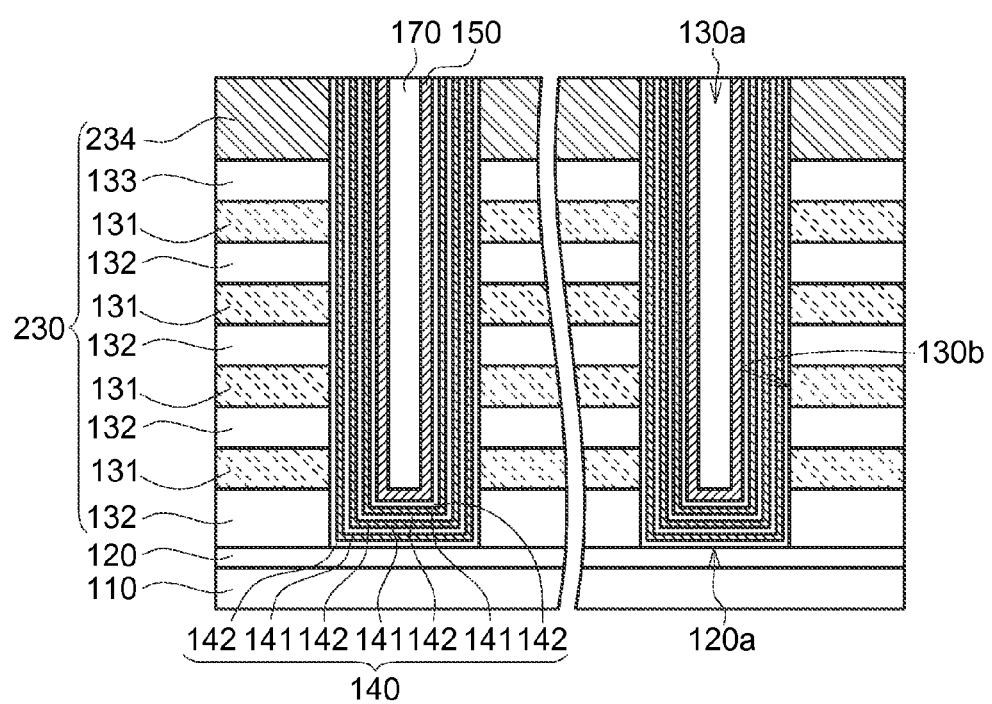
Figure 3D:
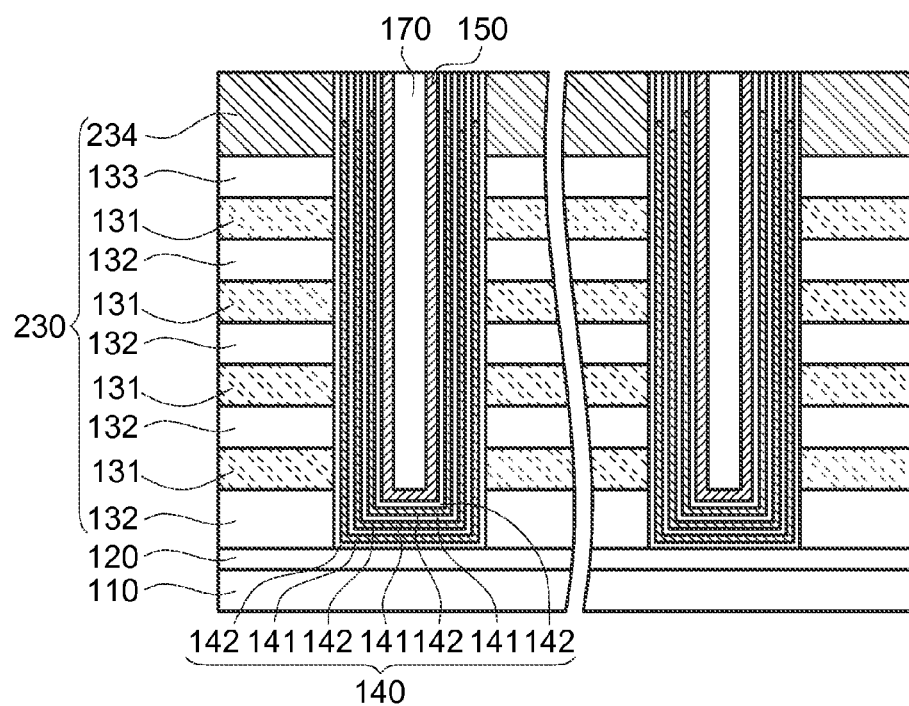
Figure 3E:
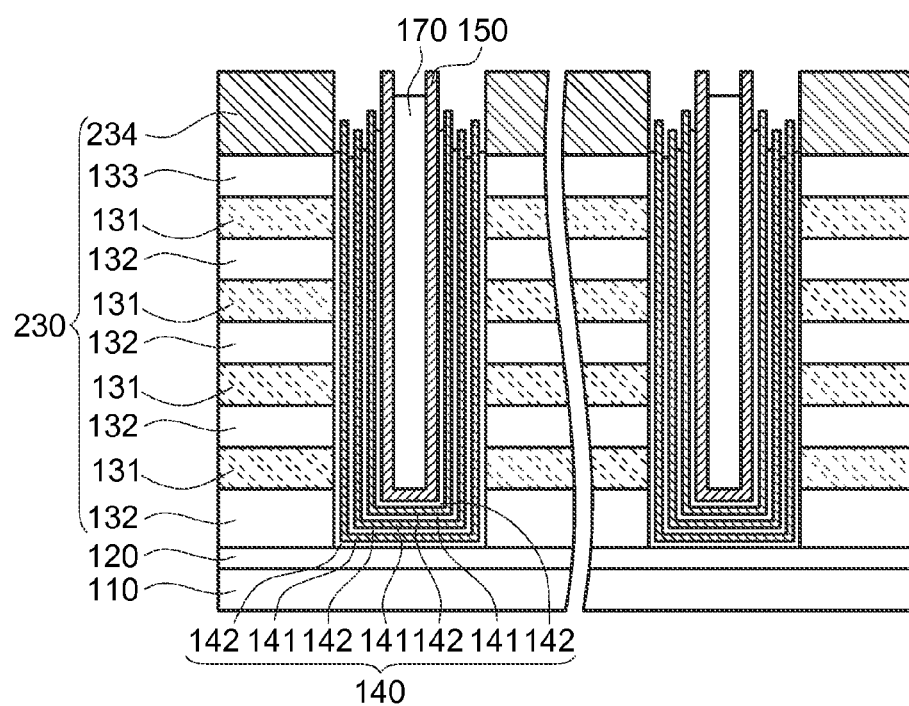
Figure 3F:
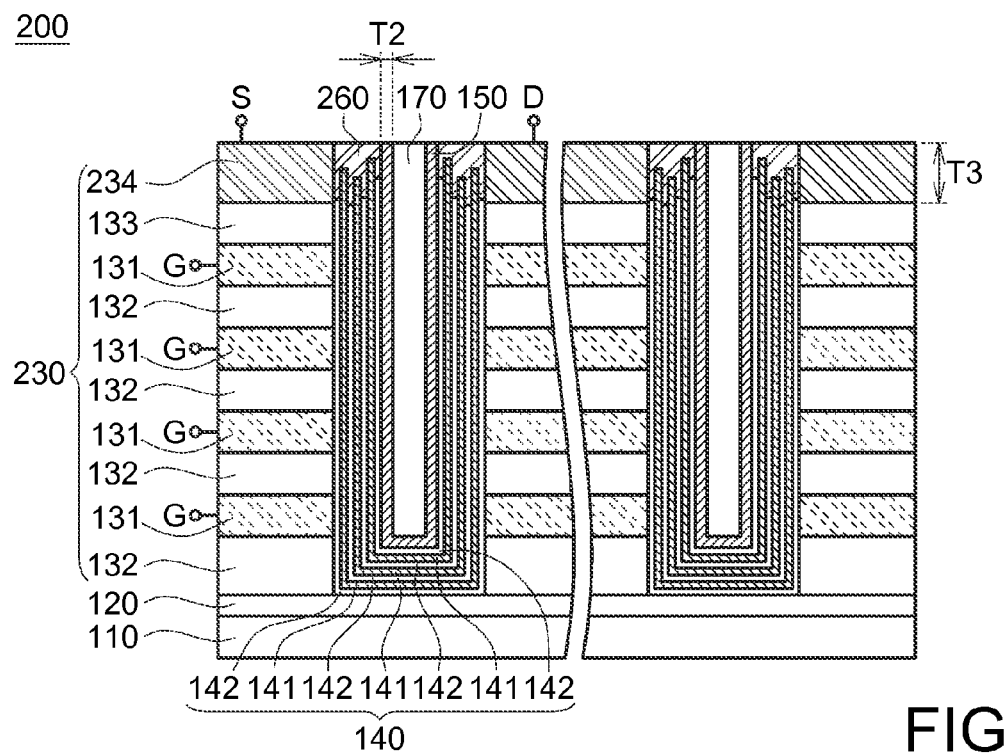

In FIG. 3F, the landing pad layer 260 and the conductive mask layer 234 are used as a landing pad for connecting the bit line. A thickness T3 of the conductive mask layer 234 and the landing pad layer 260 is larger than the thickness T2 of the channel layer 150, such that the contact resistance between the bit line and the landing pad layer 260 can be reduced. Furthermore, it is easy to make a contact between the bit line and the landing pad layer 260.

Figure 4:
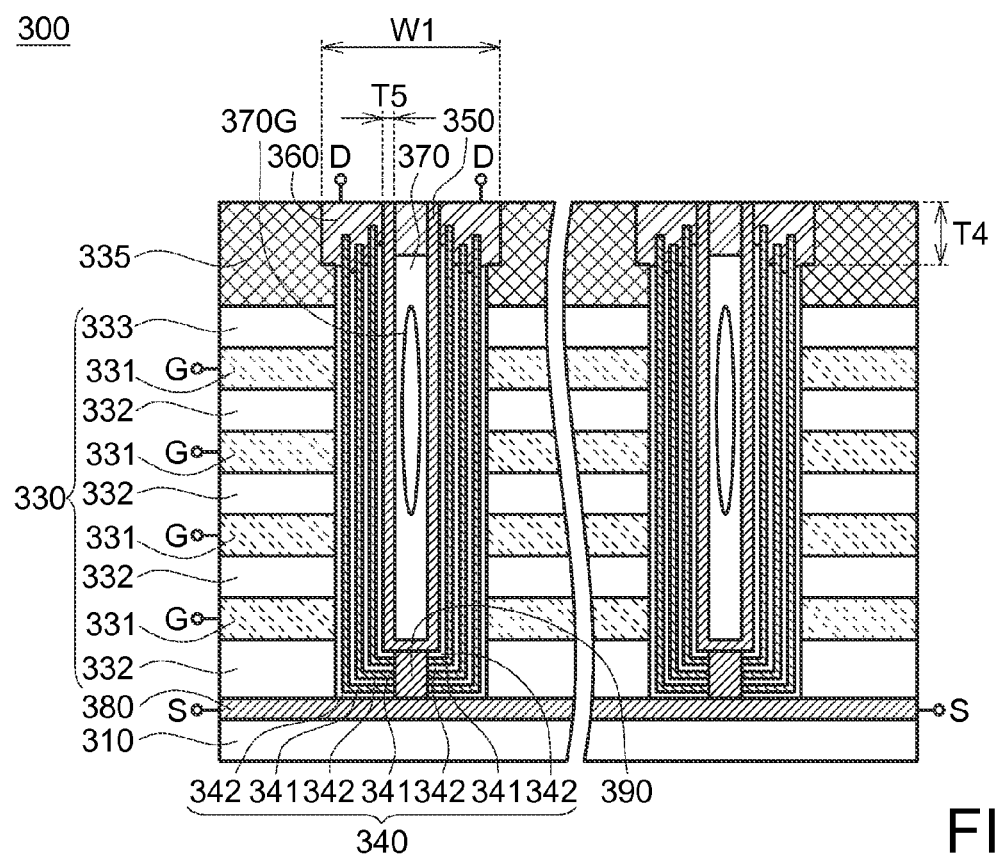
FIG. 4 shows another semiconductor device.

Please referring FIG. 4, another semiconductor device 300 is shown. For example, the semiconductor device 300 is a three-dimensional vertical channel NAND device. The semiconductor device 300 includes a substrate 310, at least two stacked structures 330, a charge trapping structure 340, a channel layer 350, an insulating mask layer 335, a landing pad layer 360, a spaced insulating layer 370, a bottom conductive layer 380 and a connection layer 390.

Each stacked structure 330 includes a plurality of gate layers 331, a plurality of gate insulating layers 332 and a top insulating layer 333. The charge trapping structure 340 includes a plurality of first dielectric layer 341 and a plurality of second dielectric layer 342. Each gate layer 331 is connected to the gate G, the landing pad layer 360 is connected to the drain D. The bottom conductive layer 380 is connected to the source S. The connection layer 390 connects the bottom conductive layer 380 and the channel layer 350.

The landing pad layer 360 is connected to a bit line. As shown in FIG. 4, because a thickness T4 of the landing pad layer 360 is larger than a thickness T5 of the channel layer 350, a contact resistance between the bit line and the landing pad layer 360 can be reduced. Furthermore, the landing pad layer 360 is further disposed on the spaced insulating layer 370. The width W1 of the landing pad layer 360 is large, such that it is easy to make a contact between the bit line and the landing pad layer 360. Moreover, the connection between the channel layer 350 and the landing pad layer 360 is at the side-wall of the channel layer 350, not at the top of the channel layer 350. It will improve the process window and reduce the resistance. In addition, no corner edge effect will be happened in this structure. The reason is that there is no first dielectric layer 341 (SiN) at any corner edge which will be easily programmed/erased due to the electric field enhancement.

Figure 5A:
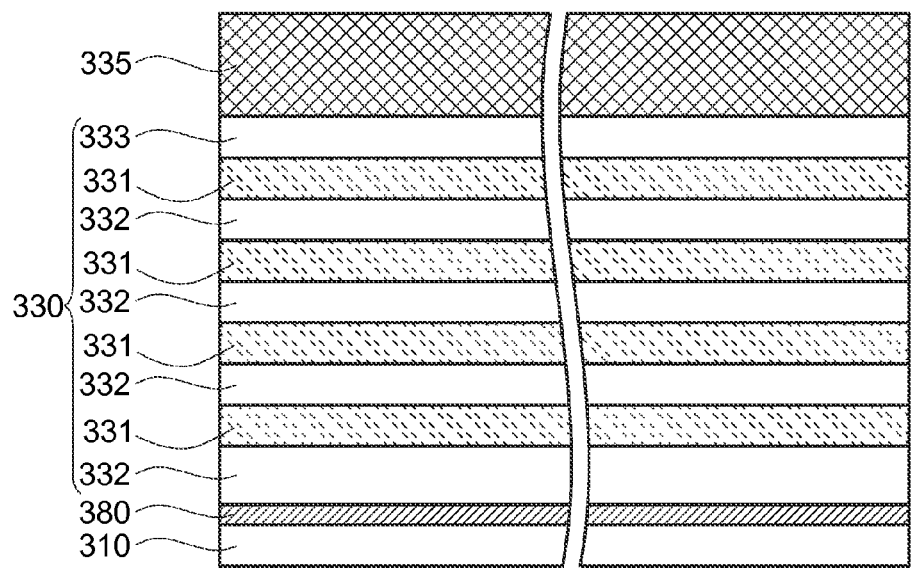
FIGS. 5A to 5F show a flowchart of a manufacturing method of the semiconductor device according to one embodiment.

Please referring to FIGS. 5A to 5F, a flowchart of a manufacturing method of the semiconductor device 300 according to one embodiment is shown. It is a self-aligned process without any additional lithography process. As shown in FIG. 5A, the substrate 310 is provided. Then, as shown in FIG. 5A, the bottom conductive layer 380 is formed on the substrate 310.

Next, as shown in FIG. 5A, the gate layers 331 and the gate insulating layer 332 are alternately formed on the bottom conductive layer 380, such that the gate layers 331 are electrically insulated with each other. For example, a material of each gate layer 331 may be N+ or P+ doping polysilicon, preferred P+ doping polysilicon, and a material of each gate insulating layer 332 is silicon oxide.

Then, as shown in FIG. 5A, the top insulating layer 333 is formed on the gate layers 331 and the gate insulating layers 332. For example, a material of the top insulating layer 333 is silicon oxide.

Afterwards, as shown in FIG. 5A, the insulating mask layer 335 is formed on the top insulating layer 333. For example, a material of the insulating mask layer 335 is silicon nitride.

Figure 5B:
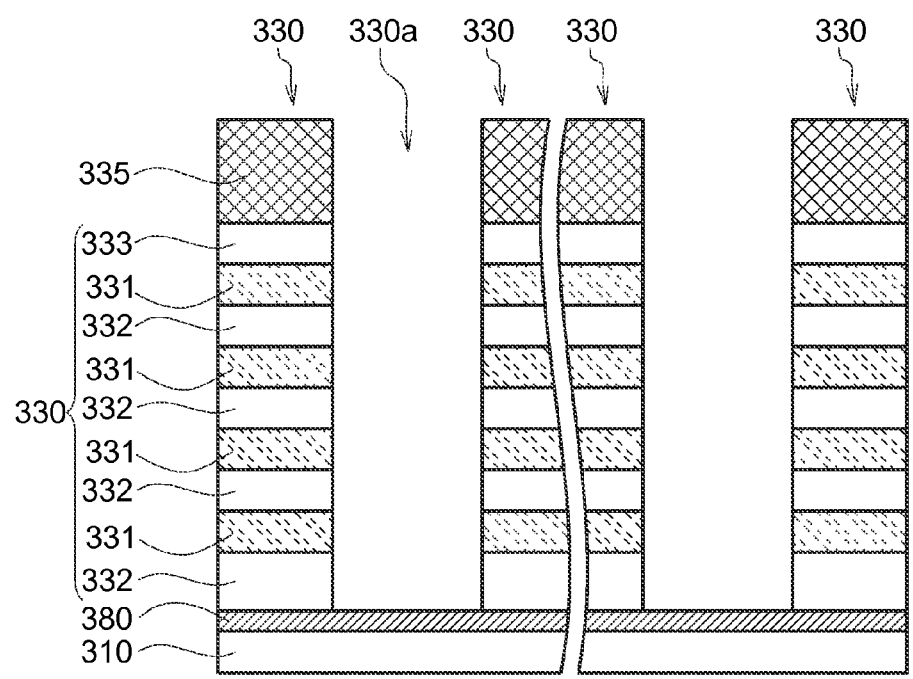

Next, as shown in FIG. 5B, the insulating mask layer 335, the top insulating layer 333, the gate layers 331 and the gate insulating layers 332 are etched to form two stacked structures 330 and a trench 330a located therebetween. The insulating mask layer 335 is used for stabilizing the stacked structures 330 during the manufacturing process.

Figure 5C:
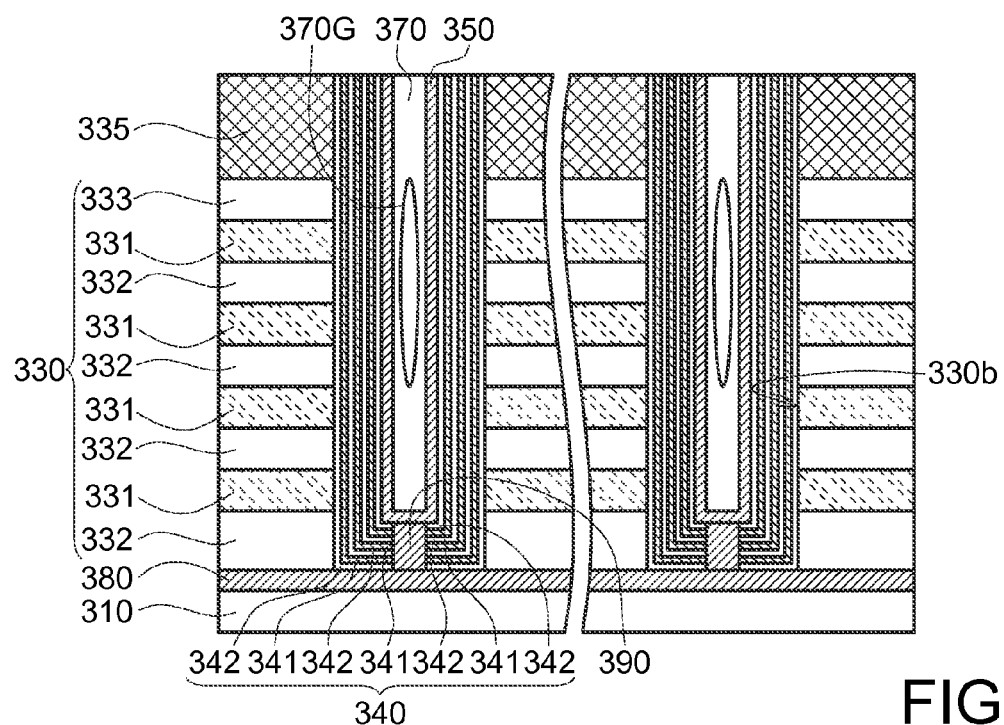

Then, as shown in FIG. 5C, the charge trapping structure 340 and the channel layer 350 are formed on a lateral surface 330b of each stacked structure 130. The connection layer 390 is formed on a top surface of the bottom conductive layer 380 to connect the bottom conductive layer 380 and the channel layer 350. A material of the channel layer 350 may be an intrinsic or undoped polysilicon. For example, the charge trapping structure 340 may be an O1N1O2N2O3N3O4 structure (O1 is closer to the channel layer 350 and O4 is closer to the stacked layer 330). The 4 different silicon oxide layers (O1, O2, O3 and O4) have different thicknesses and the 3 different silicon nitride layer (N1, N2, N3) have different thicknesses. Or, the charge trapping structure 340 may be an O1N1O2N2O3 (O1 is closer to the channel layer 350 and O3 is closer to the stacked layer 330). The 3 different silicon oxide layers (O1, O2, O3) have different thicknesses and the 2 different silicon nitride layers (N1, N2) have different thicknesses. The different thicknesses are based on the purpose of tunneling (O1N1O2), trapping (N2), blocking (O3 or O3N3N4).

Next, as shown in FIG. 5C, the spaced insulating layer 370 is filled in the trench 330a formed between the stacked structures 330. For example, a material of the spaced insulating layer 370 is silicon oxide. In this step, the spaced insulating layer 370 may not be fully filled in the trench 330a, and an air gap structure 370G may be formed in the spaced insulating layer 370. Air can be a good insulator.

Figure 5D:
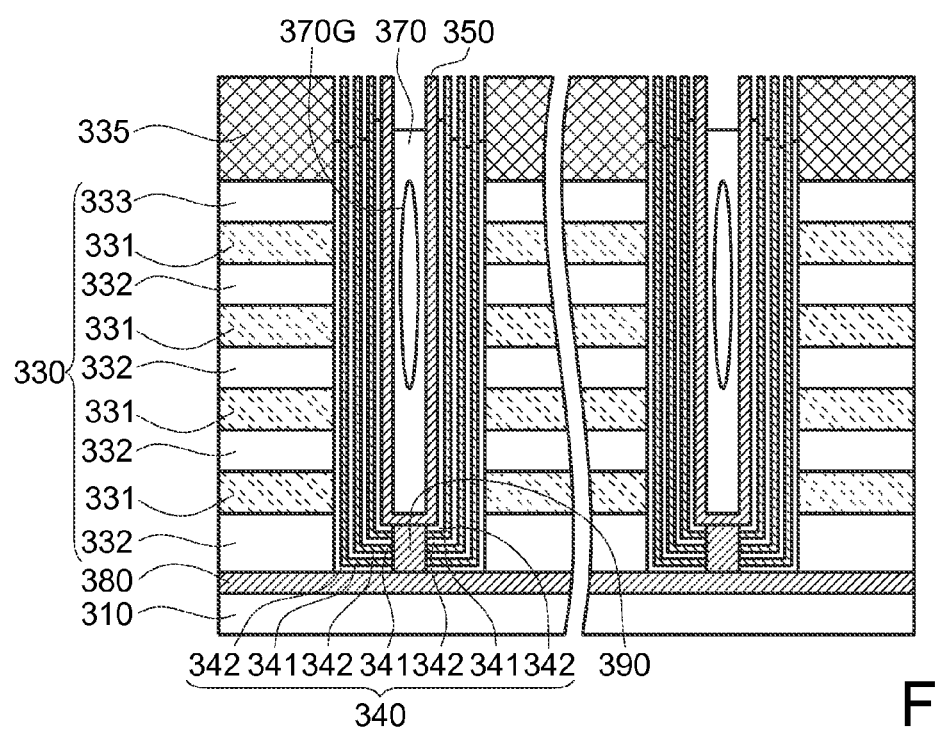

Afterwards, as shown in FIG. 5D, part of each second dielectric layer 342 is etched to expose part of each first dielectric layer 341. In this step, DHF is used for etching silicon oxide. Because DHF has high selectivity to polysilicon and silicon nitride, the insulating mask layer 335, the channel layer 350 and the first dielectric layers 341 will not be etched. Part of the second dielectric layer 342 is etched, so two lateral walls of at least one of the first dielectric layers 341 are partially exposed. Furthermore, part of the spaced insulating layer 370 is also etched, so two lateral walls of the channel layer 350 are partially exposed.

Because thicknesses of the second dielectric layers 342 are different, the second dielectric layers 342 will be etched with different depths under the etching loading effect.

Figure 5E:
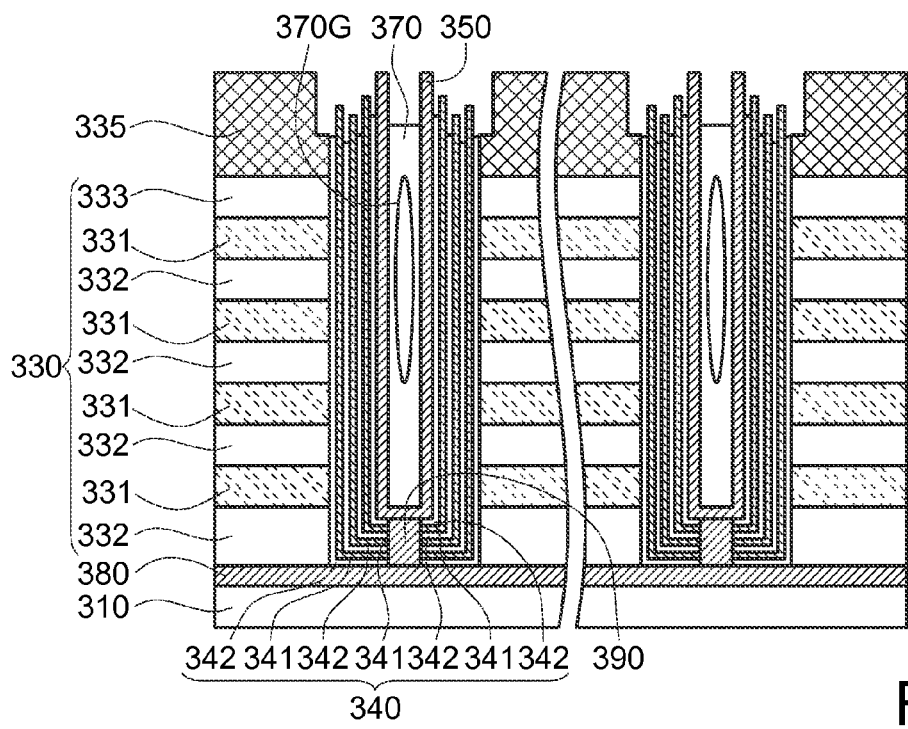

Next, as shown in FIG. 5E, part of each first dielectric layer 341 is etched. In this step, $H_3PO_4$ is used for etching silicon nitride. Because $H_3PO_4$ has high selectivity to polysilicon and silicon oxide, the channel layer 350, the second dielectric layers 342 and the spaced insulating layer 370 will not be etched. In this step, the insulating mask layer 335 is recessed.

In this step, part of each first dielectric layer 341 is etched, so two lateral walls of each second dielectric layer 342 are exposed. A top of the channel layer 350 is higher than tops of the first dielectric layers 341 and tops of the second dielectric layer 342.

Because thicknesses of the first dielectric layers 341 are different, the first dielectric layers 341 will be etched with different depths under the etching loading effect.

Figure 5F:
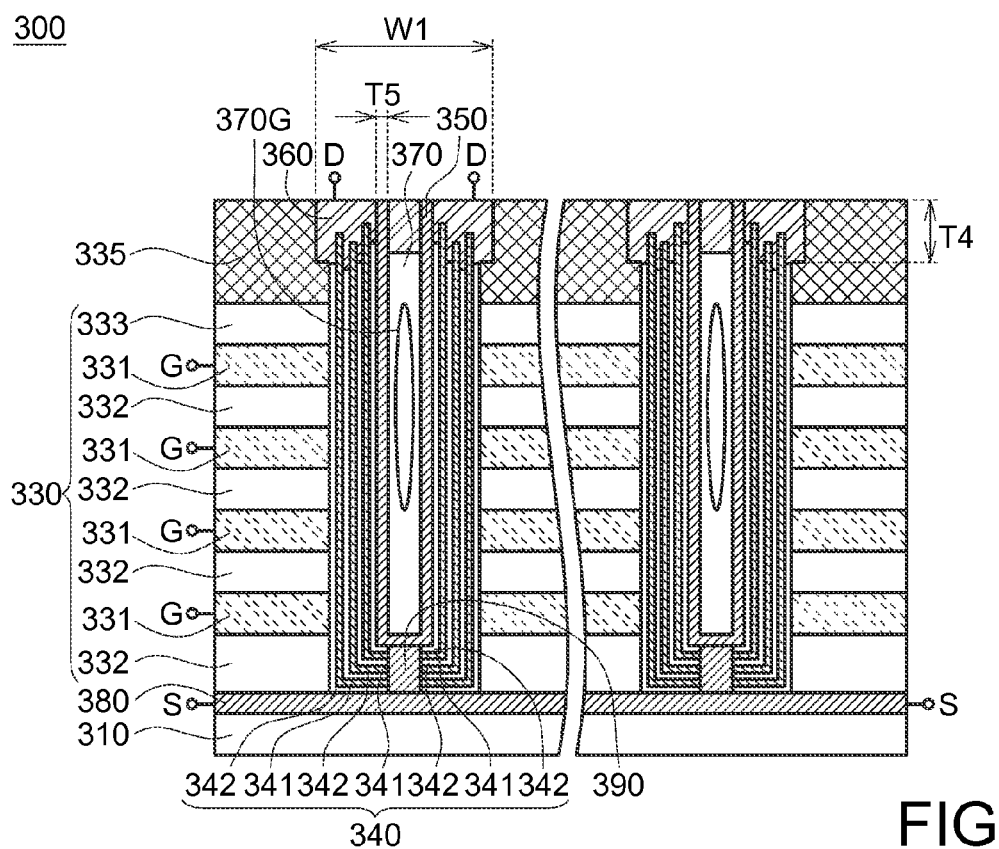

Next, as shown in FIG. 5F, the landing pad layer 360 is formed on the first dielectric layers 341, the second dielectric layers 342 and the spaced insulating layer 370 to connect the channel layer 350. For example, a material of the landing pad layer 360 is N type doping polysilicon.

The landing pad layer 360 is used as a landing pad for connecting the bit line. The thickness T4 of the landing pad layer 360 is larger than the thickness T5 of the channel layer 350, such that the contact resistance between the bit line and the landing pad layer 360 can be reduced. Moreover, the connection between the channel layer 350 and the landing pad layer 360 is at the side-wall of the channel layer 350, not at the top of the channel layer 350. It will improve the process window and reduce the resistance. The width W1 is large, such that it is easy to make a contact between the bit line and the landing pad layer 360. In addition, no corner edge effect will be happened in this structure. The reason is that no first dielectric layer 341 (SiN) at corner edge which will be easily programmed/erased due to the electric field enhancement.

In the manufacturing method described above, the insulating mask layer 335 is used for stabilizing the stacked structures 330 during the manufacturing process. In one embodiment, the manufacturing method can be performed without forming the insulating mask layer 335. Please referring to FIGS. 6A to 6F, a flowchart of a manufacturing method of a semiconductor device 400 according to another embodiment is shown. In this embodiment, a thickness of a top insulating layer 433 is increased, such that the top insulating layer 433 can be used for stabilizing the stacked structure 430.

Figure 6A:
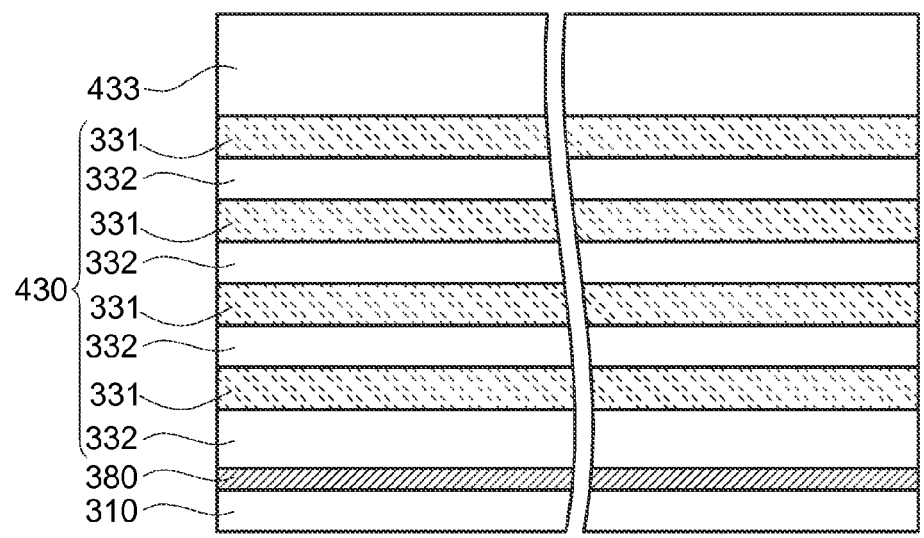
FIGS. 6A to 6F show a flowchart of a manufacturing method of the semiconductor device according to another embodiment.
Figure 6B:
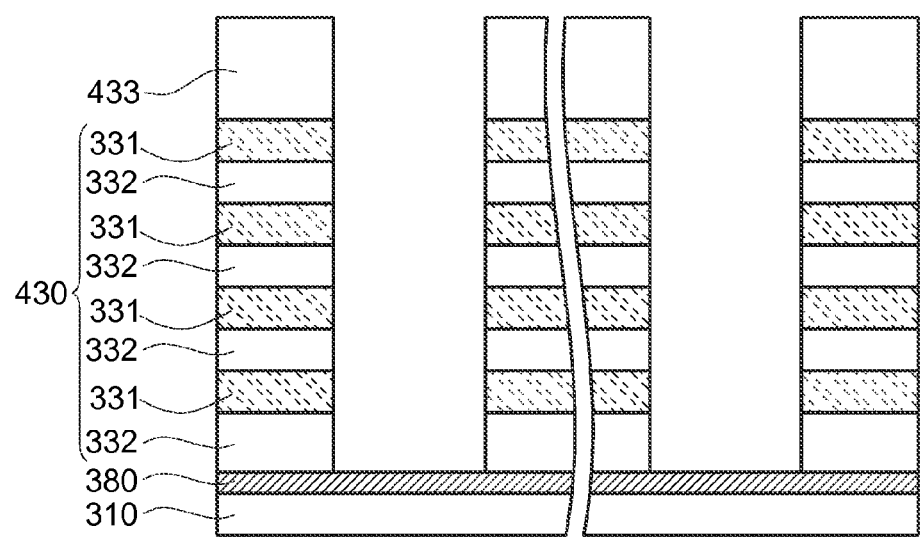
Figure 6C:
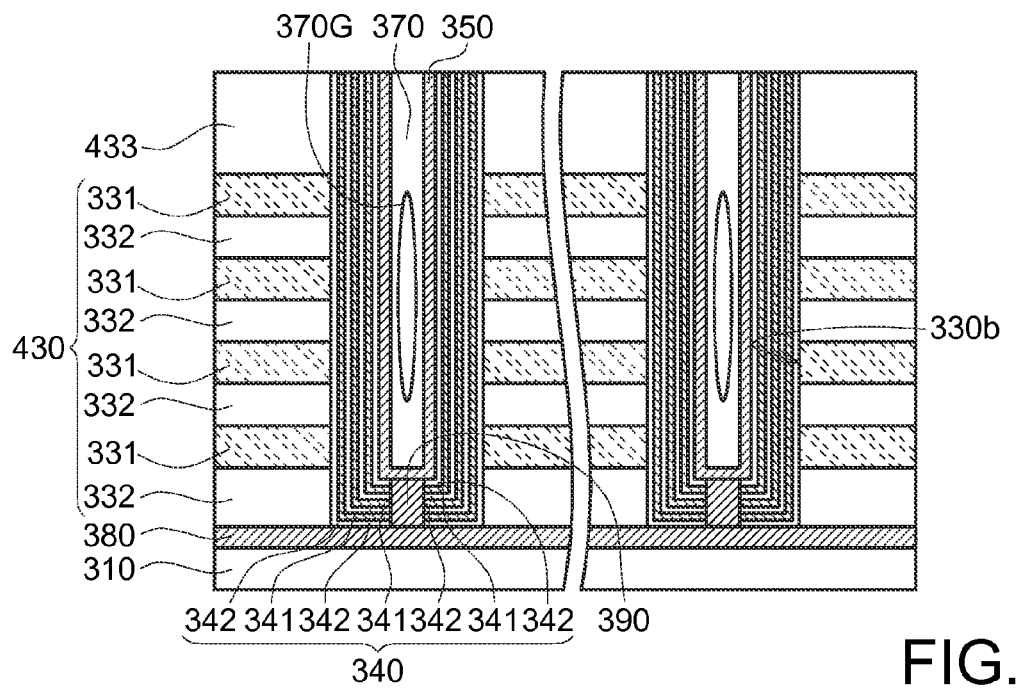
Figure 6D:
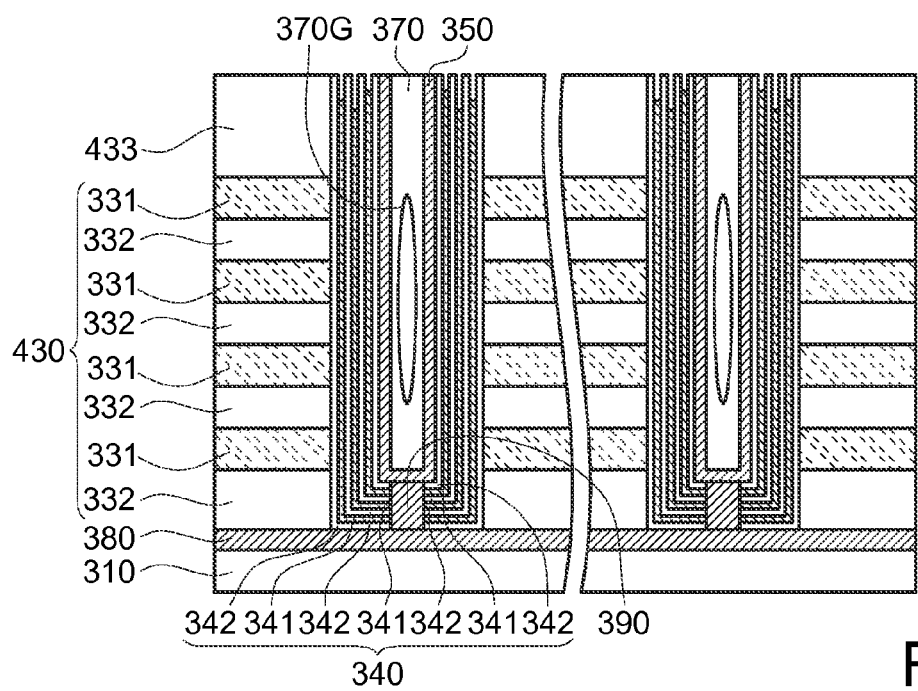
Figure 6E:
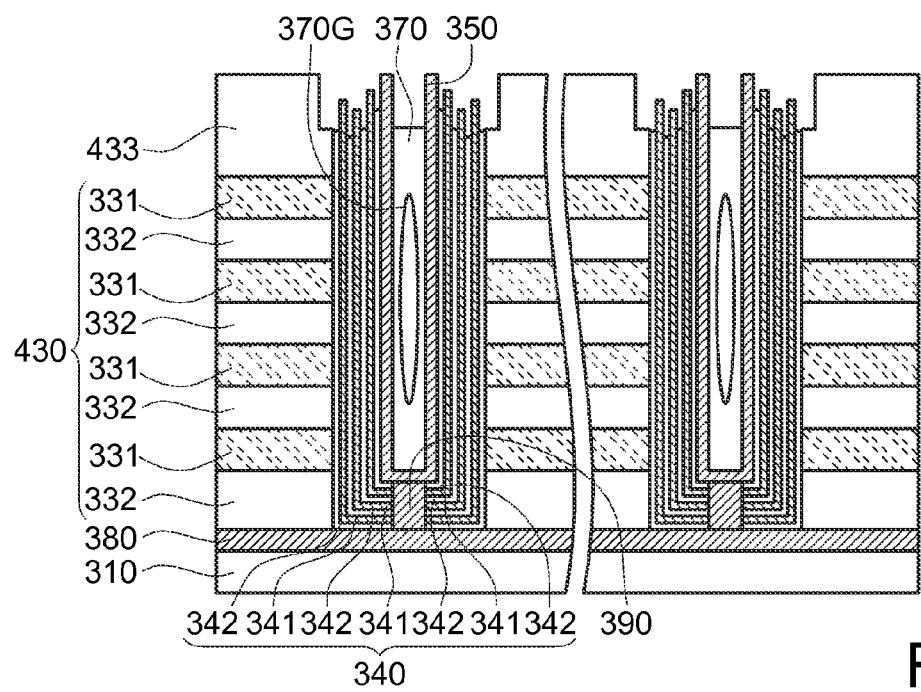
Figure 6F:
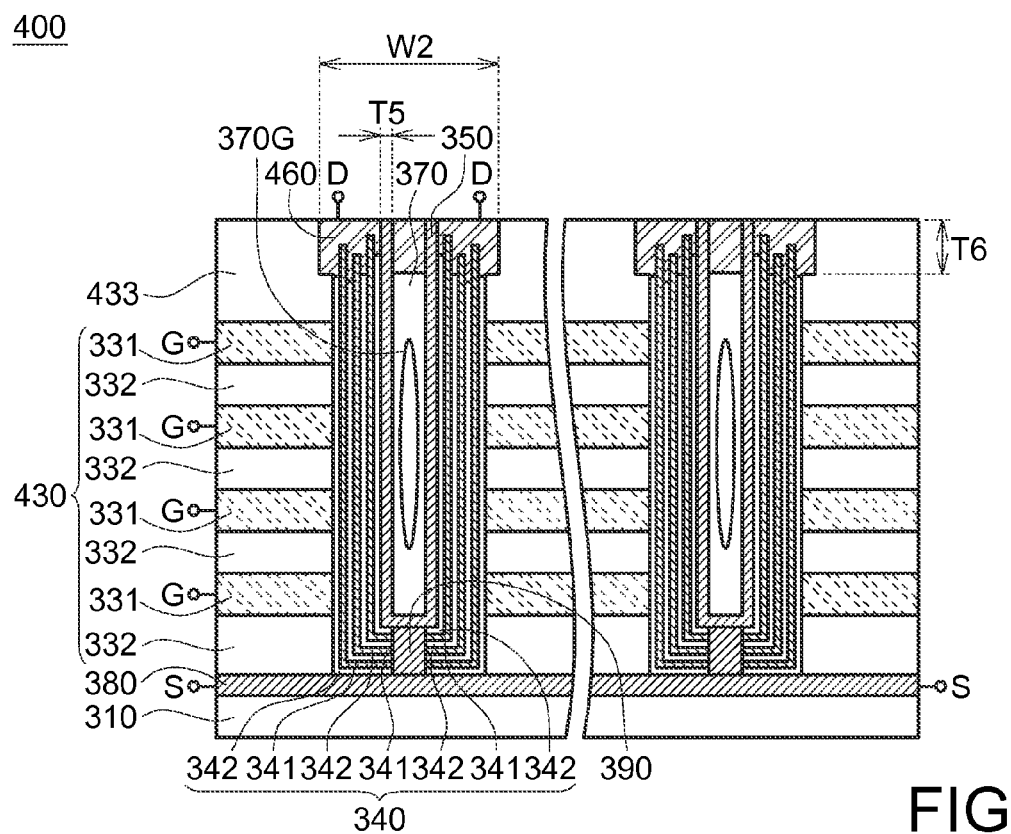

In FIG. 6F, the landing pad layer 460 is used as a landing pad for connecting the bit line. A thickness T6 of the landing pad layer 460 is larger than the thickness T5 of the channel layer 350, such that the contact resistance between the bit line and the landing pad layer 460 can be reduced. The width W2 is large, such that it is easy to make a contact between the bit line and the landing pad layer 460.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor device, comprising:
    forming two stacked structures above a substrate, wherein each of the stacked structures includes a plurality of gate layers, a plurality of gate insulating layers and a top insulating layer, the gate layers and the gate insulating layers are alternately disposed, and the top insulating layer is disposed on the gate layers and the gate insulating layers;
    forming a charge trapping structure and a channel layer on a lateral surface of each of the stacked structures, wherein the charge trapping structure includes a plurality of first dielectric layers and a plurality of second dielectric layers;
    etching part of each of first dielectric layers and etching part of each of second dielectric layers to expose part of the channel layer; and
    forming a landing pad layer on the first dielectric layers and the second dielectric layers to connect the channel layer.

2. The manufacturing method of the semiconductor device according to claim 1, wherein in the step of etching part of each of the first dielectric layers, the first dielectric layers are etched with different depths, and in the step of etching part of each of the second dielectric layers, the second dielectric layers are etched with different depths.

3. The manufacturing method of the semiconductor device according to claim 1, wherein in the step of etching part of each of the first dielectric layers, two lateral walls of at least one of the second dielectric layers are partially exposed, and in the step of etching part of each of the second dielectric layers, two lateral walls of at least one of the first dielectric layers are partially exposed.

4. The manufacturing method of the semiconductor device according to claim 1, further comprising:
    filling a spaced insulating layer in a trench formed between the stacked structures;
    wherein in the step of etching part of each of the second dielectric layers, part of the spaced insulating layer is also etched, such that a top of the channel layer is higher than tops of the first dielectric layers and tops of the second dielectric layer.

5. The manufacturing method of the semiconductor device according to claim 4, in the step of forming the landing pad layer, the landing pad layer is further formed on the spaced insulating layer.

6. The manufacturing method of the semiconductor device according to claim 1, wherein
    in the step of forming the two stacked structures, each of the stacked structures further includes a conductive mask layer disposed on the top insulating layer; and
    in the step of forming the landing pad layer, the landing pad layer is further formed on the conductive mask layer.

7. The manufacturing method of the semiconductor device according to claim 6, wherein a material of the conductive mask layer, a material of the channel layer and a material of the landing pad layer are the same.

8. The manufacturing method of the semiconductor device according to claim 6, wherein each of the stacked structures further includes an insulating mask layer disposed on the conductive mask layer, in the step of etching part of each first dielectric layer, the insulating mask layer is removed.

9. The manufacturing method of the semiconductor device according to claim 8, wherein a material of each of the first dielectric layers and a material of the insulating mask layer are the same, and the step of etching part of each of the first dielectric layers is performed before the step of etching part of each of the second dielectric layers.

10. The manufacturing method of the semiconductor device according to claim 1, wherein each of the stacked structures further includes an insulating mask layer disposed on the top insulating layer, a material of each of the first dielectric layers and a material of the insulating mask layer are the same, and the step of etching part of each of the first dielectric layers is performed after the step of etching part of each of the second dielectric layers.

11. The manufacturing method of the semiconductor device according to claim 1, wherein a material of each of the second dielectric layers and a material of the top insulating layer are the same, and the step of etching part of each of the second dielectric layers is performed after the step of etching part of each of the first dielectric layers.

* * * * *